United States Patent
Brunton (10) Patent No.: US 9,054,177 B2
(45) Date of Patent: Jun. 9, 2015

(54) METHOD AND APPARATUS FOR DIVIDING A THIN FILM DEVICE INTO SEPARATE CELLS

(75) Inventor: Adam North Brunton, Eynsham (GB)

(73) Assignee: M-SOLV LIMITED, Oxford (GB)

(*) Notice: Subject to any disclaimer, the term of this patent is extended or adjusted under 35 U.S.C. 154(b) by 0 days.

(21) Appl. No.: 14/131,830

(22) PCT Filed: Jul. 13, 2012

(86) PCT No.: PCT/GB2012/000590
§ 371 (c)(1),
(2), (4) Date: Jan. 10, 2014

(87) PCT Pub. No.: WO2013/011254
PCT Pub. Date: Jan. 24, 2013

(65) Prior Publication Data
US 2014/0162408 A1    Jun. 12, 2014

(30) Foreign Application Priority Data
Jul. 15, 2011  (GB) .................................. 1112286.8

(51) Int. Cl.
| | |
|---|---|
| H01L 21/00 | (2006.01) |
| H01L 21/78 | (2006.01) |
| B23K 26/36 | (2014.01) |
| H01L 27/32 | (2006.01) |
| B23K 26/40 | (2014.01) |
| B23K 26/38 | (2014.01) |
| H01L 31/0463 | (2014.01) |

(52) U.S. Cl.
CPC .............. *H01L 21/78* (2013.01); *B23K 26/367* (2013.01); *H01L 27/3204* (2013.01); *Y02E 10/50* (2013.01); *B23K 26/4075* (2013.01); *B23K 26/38* (2013.01); *H01L 31/0463* (2014.12)

(58) Field of Classification Search
USPC .................................................. 438/113, 110
See application file for complete search history.

(56) References Cited

U.S. PATENT DOCUMENTS

| 4,758,526 A | 7/1988 | Thalheimer |
| 2006/0196536 A1 | 9/2006 | Fujioka et al. |
| 2009/0165840 A1 | 7/2009 | Murata et al. |

FOREIGN PATENT DOCUMENTS

| GB | 2 458 986 A | 10/2009 |
| GB | 2474665 A | 4/2011 |
| GB | 2492971 A | 1/2013 |
| JP | S63192561 A | 8/1988 |
| JP | 8267265 A | 10/1996 |
| JP | 2004-330271 A | 11/2004 |
| WO | WO-00/13837 A1 | 3/2000 |
| WO | WO-2011/048352 A1 | 4/2011 |

*Primary Examiner* — Errol Fernandes
(74) *Attorney, Agent, or Firm* — Harness, Dickey & Pierce, P.L.C.

(57) ABSTRACT

A method for dividing a thin film device having a first lower electrode layer, a second active layer and a third upper electrode layer, all three layers being continuous over the device, into separate cells which are to be electrically interconnected in series, at least the dividing of the cells being carried out in a single pass of a process head across the device, the process head performing at least the following steps in the single pass: a) making a first cut through the first, second and third layers; b) making a second cut through the second and third layers, the second cut being adjacent to the first cut; c) making a third cut through the third layer, the third cut being adjacent to the second cut and on the opposite side of the second cut to the first cut; wherein at least one of the first and second cuts is formed using two laser beams sequentially during the single pass of the process head across the device, the first laser beam forming a cut through at least one of the layers and the second laser beam forming a cut through at least one other of the layers.

27 Claims, 9 Drawing Sheets

METHOD AND APPARATUS FOR DIVIDING A THIN FILM DEVICE INTO SEPARATE CELLS

CROSS-REFERENCE TO RELATED APPLICATIONS

This application is a 371 U.S. National Stage of International Application No. PCT/GB2012/000590 filed on Jul. 13, 2012, which claims priority to British Patent Application No. 1112286.8, filed on Jul. 15, 2011. The contents of the above applications are incorporated herein by reference in their entirety.

TECHNICAL FIELD

This invention relates to a method for dividing a thin film device having a first layer, which is a lower electrode layer, a second layer, which is an active layer, and a third layer, which is an upper electrode layer, all the layers being continuous over the device, into separate cells which are to be electrically interconnected in series and to apparatus for carrying out the method.

BACKGROUND ART

The usual method for the manufacture of thin film PV panels uses laser beams to scribe grooves through thin films deposited on large flat substrates. A PV panel consists of at least 3 thin film layers; a lower electrode layer, an active layer where light generates electricity and an upper electrode layer. At least one of the electrode layers is transparent so that light can reach the active layer. To increase the output voltage of the panel it is necessary to divide it into many separate cells which are electrically joined in series. The usual way to form and interconnect cells in thin film solar panels involves sequential layer coating and laser scribing processes. To complete the structure three separate coating processes and three separate laser processes are usually required. It is usual to perform these processes in a six step sequence consisting of a laser scribing step following each coating step. At each laser scribe step the requirement is to remove a single layer. The laser beams used for the 3 separate scribe steps can impinge on the substrate from either the coated side or if the substrate is transparent from the uncoated side.

In some cases this multi-step process is simplified by combining some of the separate layer coating steps. For example the lower electrode layer and the active layer (or layers) may be deposited sequentially and then both layers are scribed to form a groove through both layers. This is usually filled with an insulating material following which the interconnection procedure continues with a laser scribe through the active layer, deposition of the top electrode layer and a final scribe of the top electrode layer to isolate the cells. Thus there is a requirement in this case to scribe through 2 of the layers. The laser beam can impinge on the layers on the substrate from either the coated side of the substrate or if the substrate is transparent from the uncoated side.

WO2011/048352 describes a "one step interconnection" process in which all three layers are deposited before any laser scribing occurs. A first laser beam scribes through all three layers to form a groove which is filled with an insulating material. A second laser beam scribes through the top two layers leaving the lower electrode layer intact and conducting ink is applied to bridge across the insulator to connect the top electrode layer on one cell with the lower electrode layer on the adjacent cell. A third laser beam is used to scribe the top electrode layer to isolate the cells. Thus, in this case there is a requirement to make laser scribes through multiple layers to form the cell interconnection. WO2011/048352 also describes a "single combined process" in which all the cutting steps and ink jet processes are carried out in a single pass of the process head across the substrate. And as described in co-pending application GB (number not yet available), the laser beams used can impinge on the layers on the substrate from either the coated side of the substrate or, if the substrate is transparent, from the uncoated side.

The present invention seeks to provide a further improvement of these processes and of the apparatus used for carrying out the processes.

SUMMARY OF INVENTION

According to a first aspect of the invention, there is provided a method for dividing a thin film device having a first layer, which is a lower electrode layer, a second layer, which is an active layer, and a third layer, which is an upper electrode layer, all the layers being continuous over the device, into separate cells which are to be electrically interconnected in series, at least the dividing of the cells being carried out in a single pass of a process head across the device, the process head performing at least the following steps in the single pass:
   a) making a first cut through the first, second and third layers;
   b) making a second cut through the second and third layers, the second cut being adjacent to the first cut;
   c) making a third cut through the third layer, the third cut being adjacent to the second cut and on the opposite side of the second cut to the first cut;
   wherein at least one of the first and second cuts is formed using two laser beams sequentially during the single pass of the process head across the device, the first laser beam forming a cut through at least one of the layers and the second laser beam forming a cut through at least one other of the layers.

According to a second aspect of the invention, there is provided apparatus for dividing a thin film device having a first layer which is a lower electrode layer, a second layer which is an active layer and a third layer which is an upper electrode layer, all the layers being continuous over the device, into separate cells which are to be electrically interconnected in series, the apparatus comprising a process head on which are provided:
   a) one or more cutter units for making a first cut though the first, second and third layers, a second cut though the second and third layers adjacent to the first cut and a third cut through the third layer adjacent to the second cut and on the opposite side of the second cut to the first cut;
   b) drive means for moving the process head relative to the device; and
   c) control means for controlling movement of the process head relative to the device and actuating said one or more cutter units so that division of the device into separate cells can all be carried out in a single pass of the process head across the device,
   one or more of the cutter units comprising a first laser source and a second laser source which are spaced from each other by a fixed distance in a direction corresponding to the direction of movement of the process head during said pass, the control means being arranged to control the first and second laser sources such that at least one of the first and second cuts is formed using the first and second laser beams sequentially during the single pass of the process head across the device, the first laser beam forming a cut through at least one of the layers and the second laser beam forming a cut through at least one other of the layers.

In the thin film solar panel manufacturing cases discussed above a single laser beam is used to make each scribe whether one or more layers are to be penetrated. A single laser beam is usually highly effective in scribing through a single layer but may not be the most effective way to make scribes through more than one layer.

Hence, a key point of the invention described herein is that more than one laser beam is used to make a single scribe where more than one layer is to be penetrated. The laser beams used for each scribe are generally different in one or more of the following characteristics; wavelength, pulse length, pulse repetition rate, spot size and energy density and may impinge on the layers on the substrate from either the coated or uncoated side of the substrate. Alternatively, the laser beams used to create a single scribe can be of the same type and may even originate from the same laser source. The laser beams are spatially separated along the scribe direction such that the first laser beam interacts with the material on the substrate surface at an earlier time than the second laser beam. To ensure that the separate laser beams used to create a single scribe are accurately aligned to each other they are mounted on the same process head or on opposing process heads that are locked together so they move as one.

Preferably, the sequential laser beams are aligned so that the centre lines of the grooves formed thereby are co-incident, or at least substantially co-incident, so a cross-section of the cut formed by the two or more lasers is symmetric about its centre-line. The second laser beam is of similar width to the first or is narrower than the first laser beam. In the latter case, as the centre lines of the two beams are co-incident, the bottom of the cut will have a ledge on each side thereof.

The invention described herein thus provides the ability to select the characteristics of the laser beam used to cut through each of the individual layers. The characteristics required may differ for the respective layers, particularly when these are made of different materials, so the characteristics can be selected so as to optimise the cutting process for that particular material and/or to optimise other features of the manufacturing process.

In some cases, the different laser beams may originate from different types of laser source, eg if different wavelengths are required, but in other cases they may originate from the same type of laser source or from the same laser source. In the latter case, the laser beams may, for example, be divided and the characteristics of each part adjusted as required.

Preferred arrangements include:
the first and second laser beams being derived from different laser sources,
the first and second laser beams being the same in wavelength and pulse length,
the first and second laser beams being derived from the same laser source.

This invention is particularly appropriate to the "one step interconnection" process mentioned above for forming and connecting the cells on thin film solar panels for which scribes through two and three layers of different materials need to be made. The invention is also appropriate for the interconnection of other multi-layer thin film devices such as batteries, lighting panels based on organic or inorganic light emitting materials, actuators, etc.

Terms such as above and beneath, upperside and underside as used herein are to be understood to be refer to the relative positions of the opposite sides of a planar device (as it if were orientated with said layers provided on the upper side thereof) and are not restricted to the orientation of said device in space. In practice, the device may be in any orientation and examples are given of it being both horizontal and vertical relative to gravity.

In the detailed description of the invention that follows the cutter units that are used to form the cuts through the various layers are all based on lasers, the beams from which are focussed to ablate and remove material to form the isolating cuts. However, not all of the cuts need be made by laser (except those formed from the underside of the device or those formed by the sequential use of two or more lasers. Other methods of cutting may be used; one alternative method for forming cuts is mechanical scribing with fine wires or styli.

The description and claims refer to first, second, third laser beams etc. It should be noted that, in some cases, the 'second laser beam' referred to is a second laser used sequentially with a first laser beam to form a single groove (or cut) and in other cases the 'second laser beam' referred to is a second laser beam used to form a second groove or cut spaced from a first groove (or cut) formed by a first laser beam. The relevant meaning should, however, be clear from the context in which the term is used. The same applies to the use of the term 'third laser beam' etc.

Other preferred and optional features of the invention will be apparent from the following description and from the subsidiary claims of the specification.

BRIEF DESCRIPTION OF DRAWINGS

The invention will now be described, merely by way of example, with reference to the accompanying drawings, in which:

Figure 1:
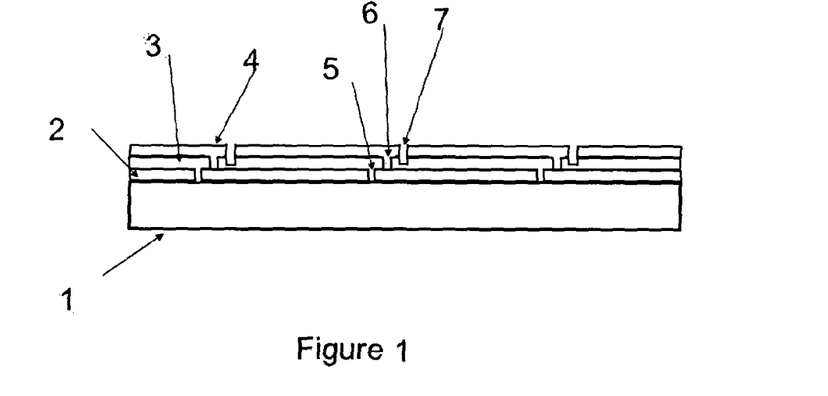

FIG. 1 shows a section of a known form of solar panel that has been subdivided into separate cells which are electrically connected in series by means of three layer coating processes and three laser scribing processes. The substrate 1 has three layers: a lower electrode layer 2, an active layer 3 and a top electrode layer 4. Laser scribes 5, 6 and 7 permit electrical connections and isolations between adjacent cells to be formed as described in the prior art referred to above.

FIGS. 2A to 2F show how a region of a solar panel in the neighbourhood of the boundary between two adjacent cells may be fabricated according to known processing techniques. FIGS. 2A to 2F show the various sequential coating and laser scribing stages that are used to form and connect the cells. In FIG. 2A the lower electrode layer 2 has been applied to the substrate 1. FIG. 2B shows how a first laser beam 8 is used to scribe line 5 through the lower electrode layer 2 to the substrate 1 to define the cell boundary. Laser beam 8 is shown impinging on the substrate 1 from the coated side but in the case where the substrate is transparent the beam can be directed through the substrate 1 from beneath. In FIG. 2C the active layer 3 has been applied to the substrate filling the first laser scribe line 5. FIG. 2D shows how a second laser beam 9 is used to scribe line 6 parallel to the first line 5 through the active layer 3 without damaging the lower electrode layer 2. In the case where the substrate 1 is transparent the second beam 9' can be directed through the substrate 1 as indicated by the arrow shown in dashed lines. In FIG. 2E a top electrode layer 4 has been applied to the substrate filling the second laser scribe line 6. FIG. 2F shows the final stage where a third laser beam 10 is used to scribe line 7 parallel to the second line 6 completely penetrating the top electrode layer 4. This scribe can partially or fully penetrate the active layer 3. In the case where the substrate 1 is transparent the third laser beam 10' may be directed through the substrate as indicated by the arrow shown in dashed lines.

Figure 3:
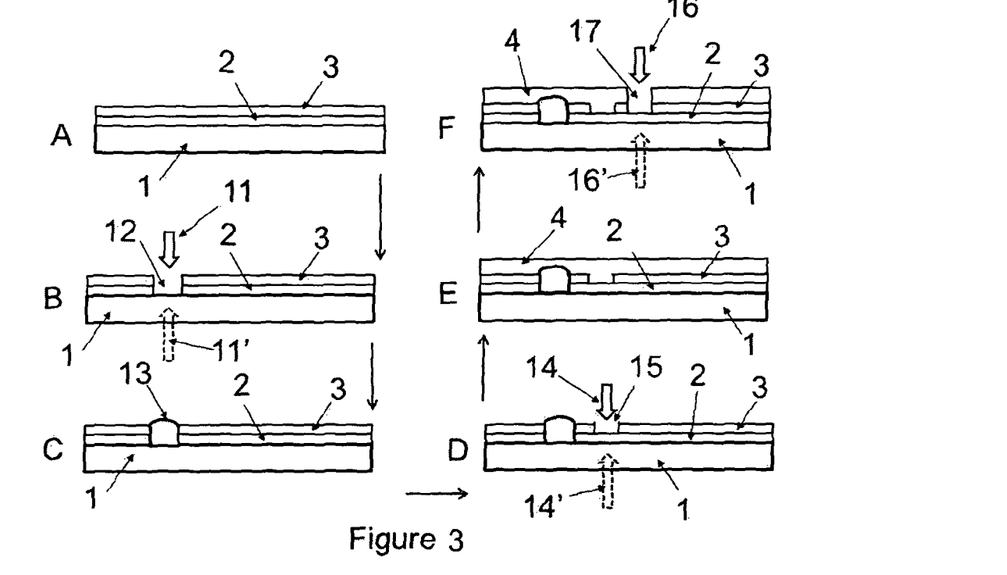

FIG. 3 shows an example of a known process in a case where both the lower electrode layer and the active layer are applied before cell interconnection proceeds. FIG. 3A shows the substrate 1 with two coating layers 2 and 3 applied. FIG. 3B shows how a first laser beam 11 or 11' is used to scribe line 12 penetrating the two layers 2 and 3 as far as the substrate. FIG. 3C shows how an insulating fluid 13 is applied into the first laser cut 12. One method for doing this is to use an ink jet nozzle. The fluid 13 is subsequently cured to form a solid. FIG. 3D shows how a second laser beam 14 or 14' is then used to scribe line 15 which penetrates the upper 3 of the two layers only. FIG. 3E shows how a top electrode layer 4 is applied filling the second laser scribe line 15. FIG. 3F shows the final stage where a third laser beam 16 or 16' is used to scribe line 17 through the top electrode layer 4. This scribe can partially or fully penetrate the active layer 3.

Figure 4:
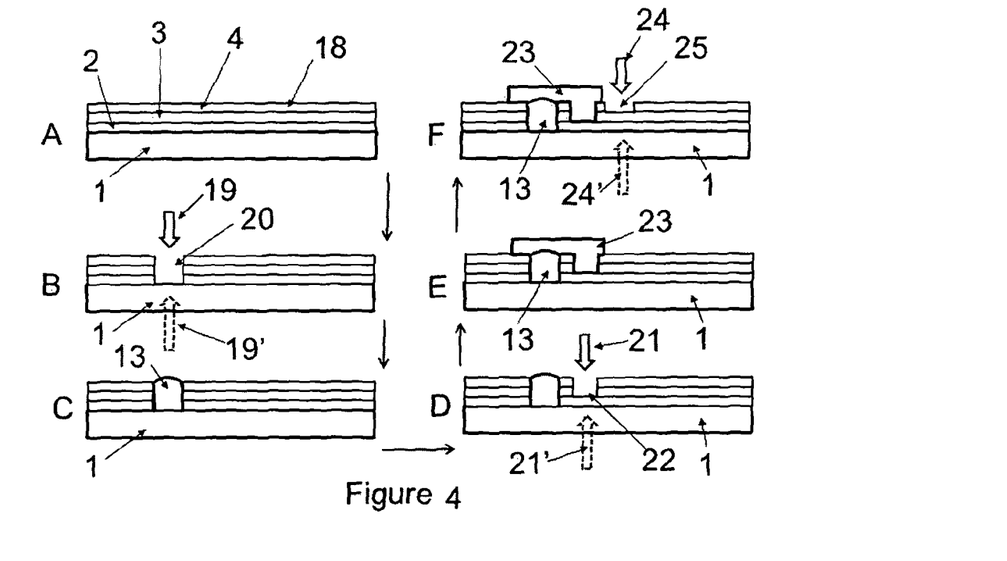

FIG. 4 shows an example of a process using the "one step interconnection" process referred to above and shows an example of a case where all three layers (the lower electrode layer, the active layer and the top electrode layer) are applied before cell interconnection proceeds. The figure shows the sequence of laser and ink jet processes delivered to the substrate surface by the apparatus as described in WO2011/048352. FIG. 4A shows a substrate 1 on which a stack of layers 18 consisting of a lower electrode layer 2, an active layer 3 and an upper electrode layer 4 has been deposited. These layers are applied sequentially without any intermediate laser processes. FIG. 4B shows the first of the three laser processes that are then carried out. A first laser beam 19 or 19' is used to scribe line 20 through all 3 layers as far as the substrate 1. After the first laser process has been completed, insulating material is immediately applied by ink jet printing into the first laser scribe line. FIG. 4C shows how an insulating fluid 13 is applied into the first laser scribe line 20 by means of a first ink jet nozzle (not shown). The fluid 13 is immediately UV cured (or thermally cured at a later stage) to form a solid. FIG. 4D shows the next step where a second laser beam 21 or 21' is used to scribe line 22 parallel to the first scribe line 20 through the top two layers as far as the lower electrode layer 2. FIG. 4E shows the next step where fluid 23 that is conducting or contains conducting particles is applied by means of a second ink jet nozzle (not shown) over the insulating material 13 in the first scribe line 20 and also into the second laser scribe line 22. The fluid 23 is subsequently thermally cured to form a solid. The conducting material 23 forms a bridge over the insulating material 13 to electrically connect the top electrode layer 4 on the left side of the interconnect to the bottom electrode layer 2 on the right side of the interconnect to connect adjacent cells in series. FIG. 4F shows the last step in the interconnection process where a third laser beam 24 or 24' is used to scribe line 25 through the upper layer parallel to and beside the second scribe line 22 on the side away from the first scribe line 20. This scribe can also penetrate partially or fully into the active layer 3 but must not damage the lower electrode layer 2.

As described in WO2011/048352, all three adjacent laser scribes 20, 21, 24 are carried out at the same time as the process head moves across the substrate surface.

Figure 2:
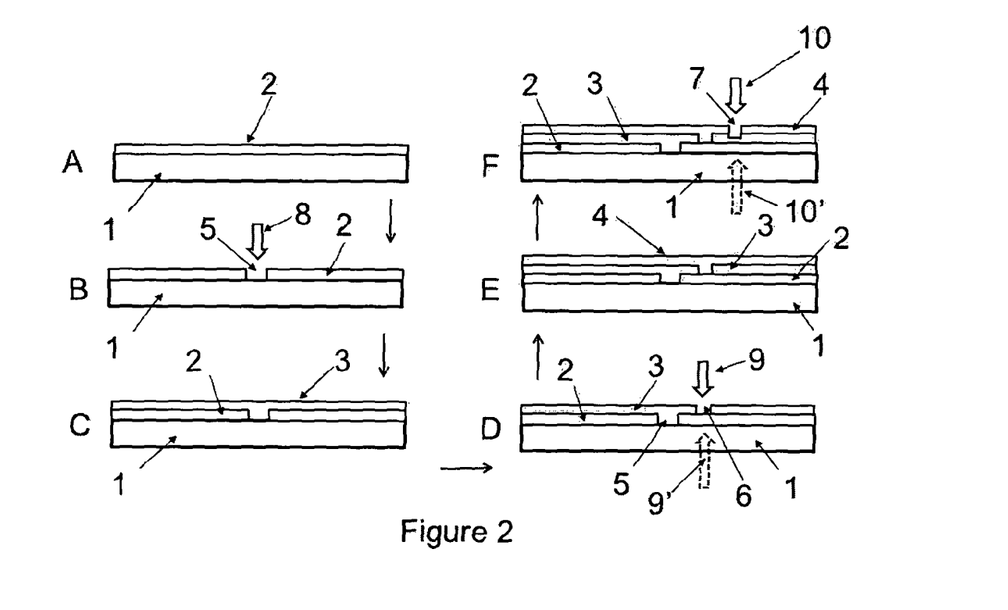
Figure 5:
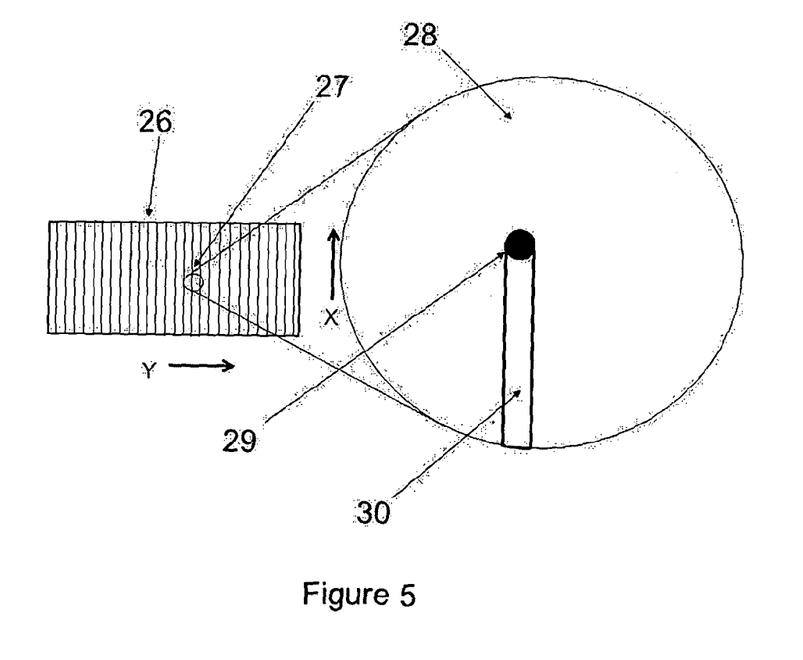

FIG. 5 shows known apparatus for carrying out laser scribing methods used to scribe grooves through the layers in thin film solar panels as illustrated in FIGS. 1 to 3 where each scribe line is made by a single laser beam and only a single type of line is scribed at a time. FIG. 5 illustrates the typical process head arrangement. A solar panel 26 has multiple cells along its length in the direction Y. This means that interconnections are made by relative motion of the process head with respect to the panel in the direction X. An area of the panel 27 that includes a region where adjacent cells are to be connected is shown enlarged on the right side of the figure and shows part of a moving process head 28 with an associated laser beam 29 used to scribe a single line 30 through one or more layers on the substrate as the head moves across the substrate. Instead of moving the process head over a stationary substrate surface in the direction X (as shown), the same result can be achieved by holding the process head 28 stationary and moving the panel in the opposite X direction. Relative motion of the process head and substrate can be in either X direction.

Figure 6:
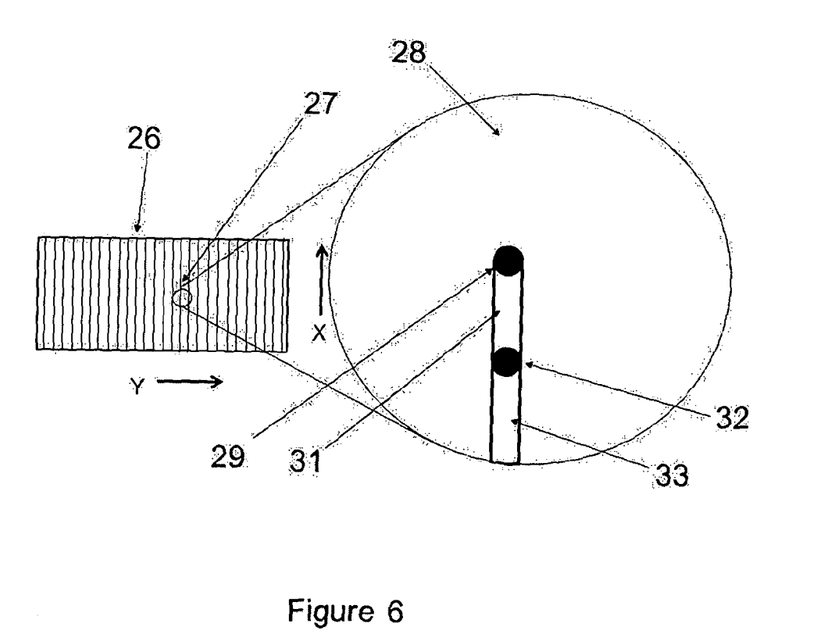

FIG. 6 illustrates how the apparatus shown in FIG. 5 may be modified in accordance with one embodiment of the present invention in a case where the substrate has two or more layers deposited on it and which uses two separated laser beams sequentially applied to the substrate to form a single scribe line through the two or more layers in a single pass of the process head. A solar panel 26 has multiple cells along its length in the direction Y. This means that interconnections are made by relative motion of the process head with respect to the panel in the direction X. An area of the panel 27 that includes a region where adjacent cells are to be connected is shown enlarged on the right side of the figure. This shows part of the moving process head 28 which is arranged so that two separate laser beams 29 and 32 are delivered sequentially to the substrate in order to scribe a single line through two or more layers on the substrate as the head moves across the substrate. First laser beam 29 scribes through the upper layer to form scribe 31 and, following this, second laser beam 32 scribes through a lower layer to complete the scribe 33 to the required depth. First and second laser beams are generally different in terms of one or more of wavelength, pulse length, energy density or spot size but in some cases the laser beams may be similar or even identical.

Figure 7:
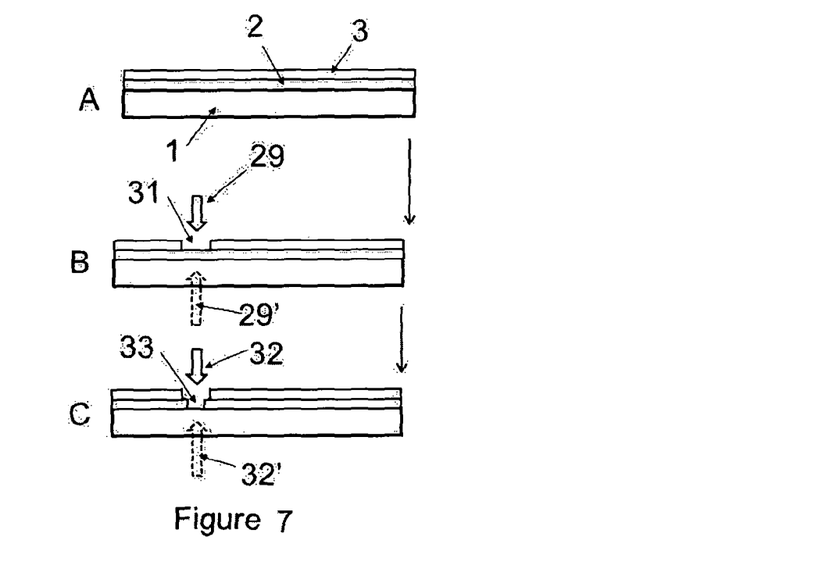

FIG. 7 shows the two sequential laser process steps described above in the case where the substrate has two layers deposited on the surface and a dual laser beam process head of the type shown in FIG. 6 is moved across the substrate. FIG. 7A shows the initial substrate 1 with the lower electrode layer 2 and the active layer 3 applied before any laser processes are carried out. FIG. 7B shows the first laser step whereby first laser beam 29, applied from the upper side, scribes through the upper active layer 3 without damaging the lower electrode layer 2 to create a groove 31. FIG. 7B also shows an alternative first laser step that can be used if the substrate and lower electrode layer are transparent. In this case, first laser beam 29' is delivered through the transparent substrate 1 to remove the upper active layer 3 to create groove 31. FIG. 7C shows the second laser step whereby second laser beam 32 or 32' removes the lower electrode layer to create groove 33. The width of the groove 33 through the lower electrode layer created in the second laser step may be the same as the groove 31 created by the first step or alternatively it may be narrower as shown.

Figure 8:
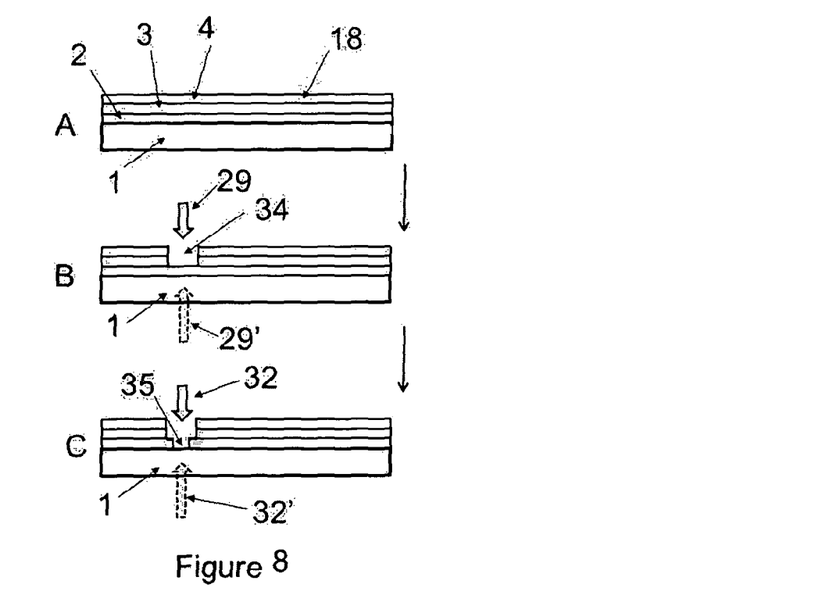

FIG. 8 shows the two sequential laser process steps described above in the case where the substrate has three layers deposited on the surface and a dual laser beam process head of the type shown in FIG. 6 is moved across the substrate. FIG. 8A shows the initial substrate 1 with the lower electrode layer 2, the active layer 3 and the upper electrode layer 4 all applied prior to any laser processing. FIG. 8B shows the first laser step whereby first laser beam 29, applied from the upper side, scribes through the upper electrode layer 4 and the active layer 3 without damaging the lower electrode layer 2 to create a groove 34. FIG. 8B also shows an alternative first laser step that can be used if the substrate and lower electrode layer are transparent. In this case, first laser beam 29' is delivered through the transparent substrate to remove the upper electrode layer 4 and the active layer 3 to create a groove 34. FIG. 8C shows the second laser step whereby a second laser beam 32 or 32' removes the lower electrode layer to create groove 35. The width of the groove 35 through the lower electrode layer created in the second laser step may be the same as the groove. 34 created by the first step or alternatively it may be narrower as shown.

Figure 9:
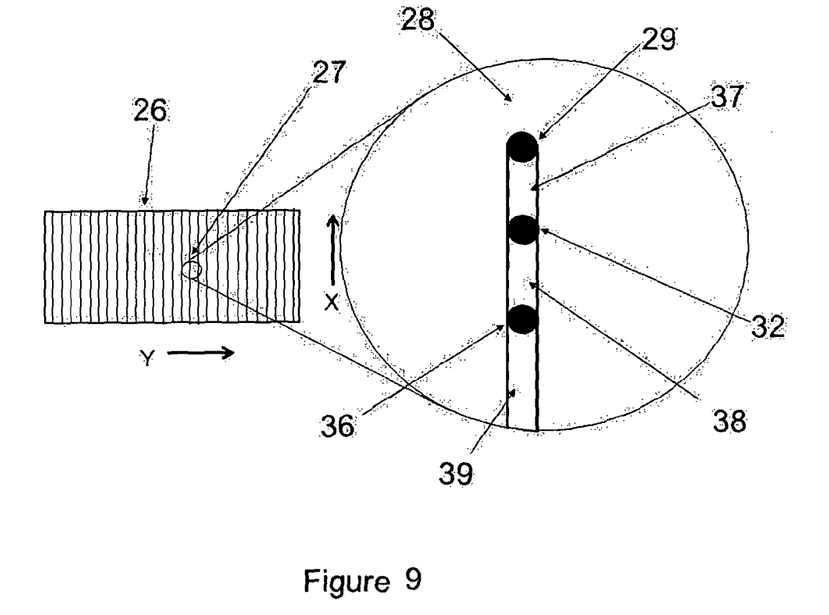

FIG. 9 introduces the use of three sequential laser processes in accordance with a further embodiment of the invention in the case where the substrate has at least three layers deposited on it and which uses three laser beams sequentially applied to the substrate to form a single scribe line through all layers in a single pass of the process head. A solar panel 26 has multiple cells along its length in the direction Y. An area of the panel 27 that includes a region where adjacent cells are to be connected is shown enlarged on the right side of the figure. This shows part of the moving process head 28 which is arranged such that three laser beams 29, 32 and 36 are delivered sequentially to the substrate in order to scribe a single line through all layers on the substrate as the head moves across the substrate. First laser beam 29 scribes through at least the top electrode layer 4 to form scribe 37. Following this, second laser beam 32, scribes through at least the active layer 3 to form scribe 38. Finally, third laser beam 36 removes the lower electrode layer to complete the scribe 39 to the required depth. The width of the three scribes can be the same or different. The first, second and third laser beams are generally different in terms of one or more of wavelength, pulse length, energy density or spot size but in some cases two or even three of the laser beams may be similar or even identical.

Figure 10:
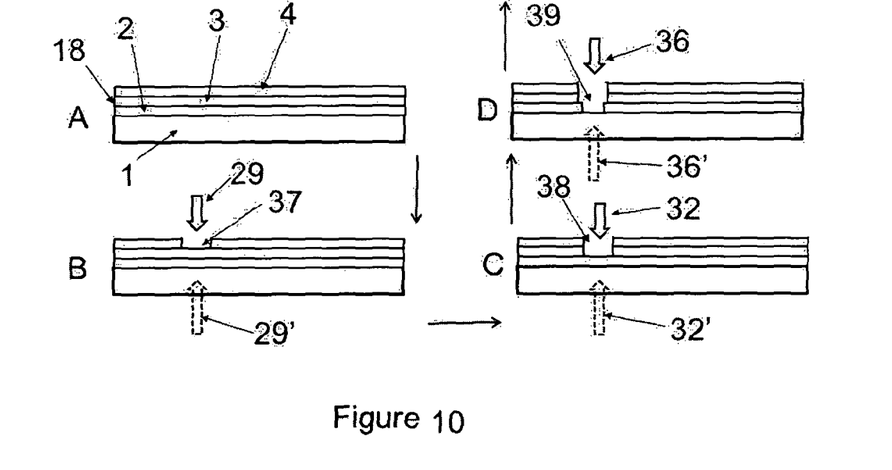

FIG. 10 shows the three sequential laser process steps described above in the case where the substrate has three layers deposited on the surface and a triple laser beam process head of the type shown in FIG. 9 is moved across the substrate. FIG. 10A shows the initial substrate 1 with the lower electrode layer 2, the active layer 3 and the upper electrode layer 4 all applied prior to any laser processing. FIG. 10B shows the first laser step whereby first laser beam 29, applied from the upper side, scribes through the upper electrode layer 4 to create a groove 37. FIG. 10B also shows an alternative first laser step that can be used if the substrate and lower electrode layer are transparent. In this case, first laser beam 29' is delivered through the transparent substrate to remove the upper electrode layer 4 to create a groove 37. FIG. 10C shows the second laser step whereby second laser beam 32 or 32' removes the active layer to create groove 38. The width of the groove 38 through the active layer created in the second laser step may be the same as the groove 34 created by the first step as shown or, alternatively, it may be narrower. FIG. 10D shows the third laser step whereby a third laser beam 36 or 36' removes the lower electrode layer to create groove 39. The width of the groove 39 through the lower electrode layer created in the third laser step may be the same as the grooves 37 or 38 created by the first and second laser steps or, alternatively, it may be narrower as shown.

Figure 11:
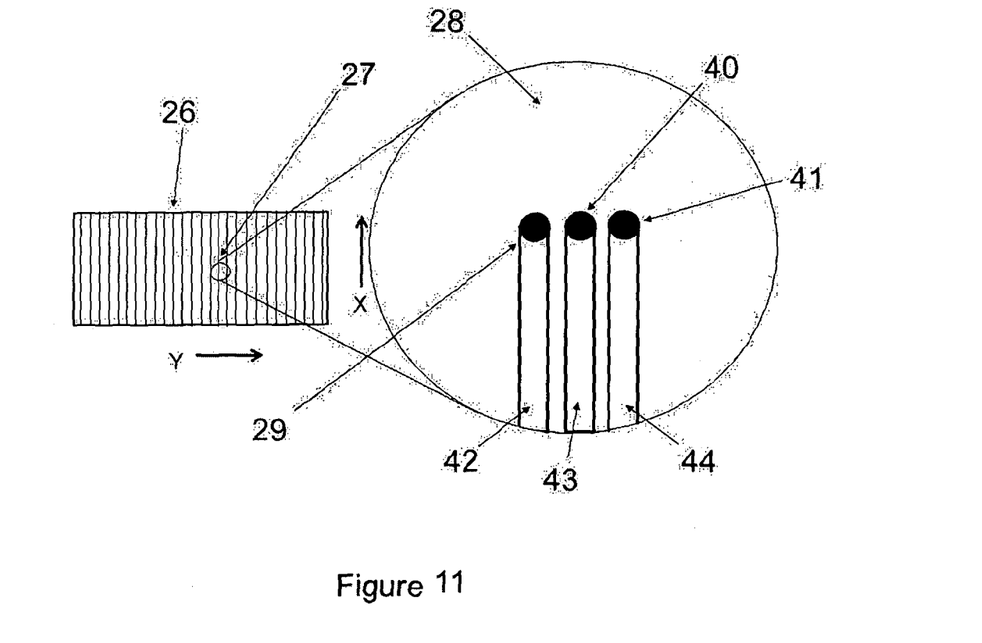

FIG. 11 shows a known form of process head as described in WO2011/048352 used to scribe grooves through the layers in thin film solar panels (the steps for which are illustrated in FIG. 4). The figure illustrates a process head as described in WO2011/048352 for forming three scribes as required for the process shown in FIG. 4 with all three scribes being made during a single passage of the process head across the substrate. A solar panel 26 has multiple cells along its length in the direction Y. An area of the panel 27 that includes a region where adjacent cells are to be connected is shown enlarged on the right side of the figure. This shows part of the moving process head 28 which is arranged such that three laser beams 29, 40 and 41 are delivered in parallel to the substrate in order to scribe three parallel grooves through all or some of the layers on the substrate as the head moves across the substrate. First laser beam 29 scribes through all three layers to form scribe 42. Second laser beam 40 scribes through the top two layers to form scribe 43. Third laser beam 41 scribes through at least the top layer to form scribe 44. The three laser beams used can be of similar or different type and the width of the three parallel scribes formed can be the same or different. Note that the three laser beams do not have to be aligned as shown in the figure where all three scribes take place at the same time. Beams can be positioned such that scribes can be made in any order. Various additional ink jet processes are required to complete the cell interconnection as shown in FIG. 4 but these are not shown in FIG. 11.

Figure 12:
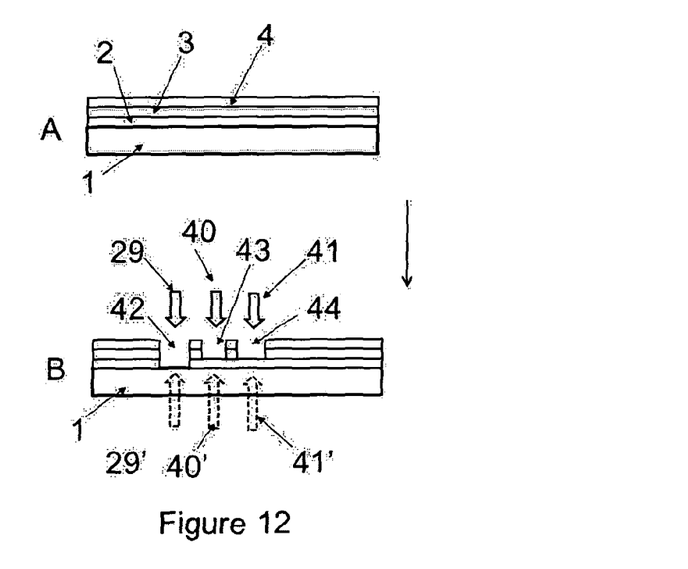

FIG. 12 illustrates a known process using three laser process steps for the case where the substrate has three layers deposited on the surface and a triple laser beam process head of the type shown in FIG. 11 is moved across the substrate. FIG. 12A shows the initial substrate 1 with the lower electrode layer 2, the active layer 3 and the upper electrode layer 4 all applied prior to any laser processing. FIG. 12B shows the three laser processes that are carried out in parallel, ie during the single pass of the process head across the substrate. First laser beam 29 or 29' creates a groove 42 by removing all three layers. Second laser beam 40 or 40' creates groove 43 by removing the upper electrode layer and the active layer leaving the lower electrode layer. Third laser beam 41 or 41' creates groove 44 by removing the upper electrode layer and also partially or fully removing the active layer 3. Note that the three laser scribes do not have to be carried out at the same time and can be performed in any desired order by suitable arrangement of the position of the beams on the process head. Various additional ink jet processes are required to complete the cell interconnection as shown in FIG. 4 but these are not shown in FIG. 12.

Figure 13:
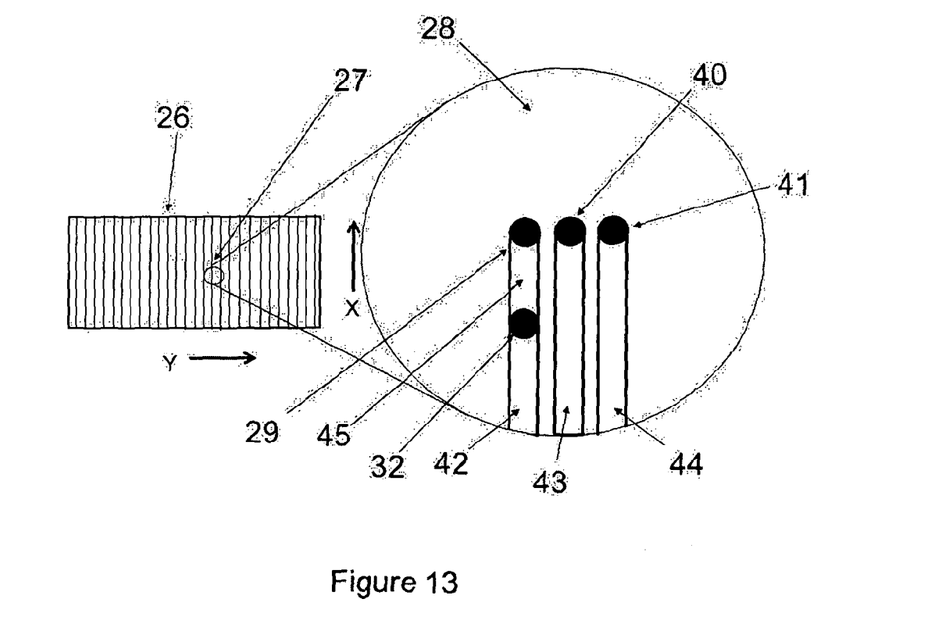

FIG. 13 shows an embodiment of the present invention applied to the "one step interconnection" processes described in WO2011/048352 and illustrated in FIGS. 4, 11 and 12. FIG. 13 illustrates an arrangement used where all three scribes needed for the process shown in FIG. 12 are made during the single passage of the process head across the substrate. A solar panel 26 has multiple cells along its length in the direction Y. An area of the panel 27 that includes a region where adjacent cells are to be connected is shown enlarged on the right side of the figure. This shows part of the moving process head 28 which is arranged such that first, second and third laser beams 29, 40, and 41 are delivered to the substrate in order to scribe three parallel grooves through one or two of the layers on the substrate as the head moves across the substrate. In the figure, the first, second and third laser beams are arranged such that the three scribes take place at the same time. This is not a requirement of our process and the scribes can take place at different times and in any order during the passage of the head over the substrate so long as all scribes are completed during a single pass of the head. In a first preferred embodiment, first laser beam 29 forms first scribe 45, second laser beam 40 forms second scribe 43 and third laser beam 41 forms third scribe 44 all of which are similar in that the top two layers of material are removed leaving the lower electrode layer intact. In this case, the first, second and third laser beams can have similar or even identical properties in terms of wavelength, pulse length, spot size and energy density (which is convenient in practice). For successful cell interconnection, it is only required that laser beam 41 removes the top layer and partial or even full penetration of the active layer has no detrimental effect on the cell interconnection so in another embodiment of the invention, first laser beam 29 and second laser beam 40 both remove the top two layers whereas third laser beam 41 removes either only the top electrode layer or the top layer and some of the active layer. After the first, second and third laser beams have passed over the substrate, second 43 and third 44 scribes are complete but first scribe 45 is incomplete as complete removal of the lower electrode layer is required to allow eventual cell formation and interconnection. Hence, fourth laser beam 32 is directed into scribe 45 after the first laser beam 29 has passed and removes the lower electrode layer to complete the scribe 42 to the required depth. The width of the first, second and third scribes created can be the same or different. The width of the scribe created by the fourth laser beam 32 can be the same or less than that created by the first laser beam.

Figure 14:
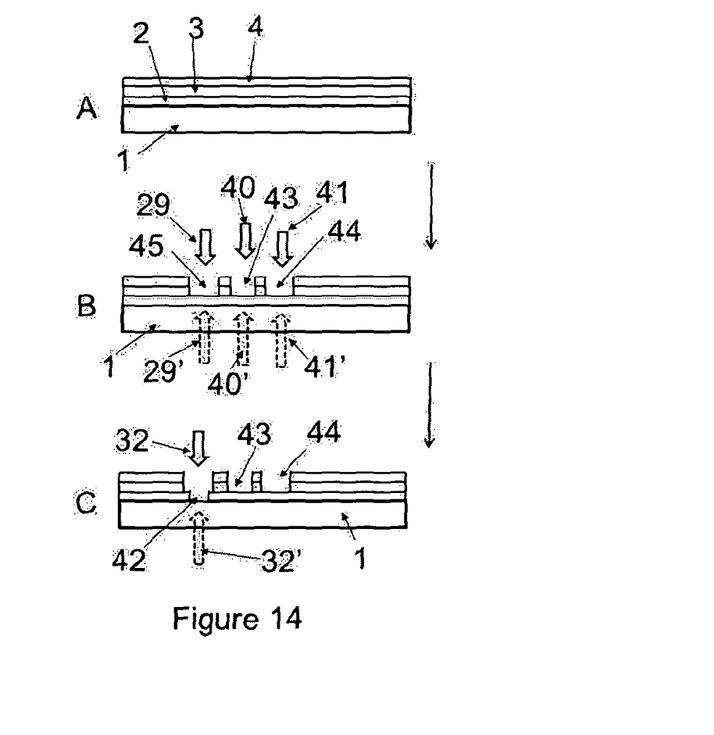

FIG. 14 shows the four laser process steps for the case where the substrate has three layers deposited on the surface and a quadruple laser beam process head of the type shown in FIG. 13 is moved across the substrate. FIG. 14A shows the initial substrate 1 with the lower electrode layer 2, the active layer 3 and the upper electrode layer 4 all applied prior to any laser processing. FIG. 14B shows the laser processes performed by the first, second and third laser beams. First laser beam 29 or 29' creates groove 45 and second laser beam 40 or 40' creates groove 43 by removing the upper electrode layer and the active layer leaving the lower electrode layer. Third laser beam 41 or 41' creates groove 44 by removing the upper electrode layer with the additional possibility of partially or fully removing the active layer 3. FIG. 14C shows the laser process carried out by the fourth laser beam which is directed into the groove 45 formed by first laser beam 29 at a time after the interaction of the first laser beam with the substrate. Fourth laser beam 32 or 32' forms scribe 42 by removing the material of the lower electrode layer 2. The width of scribe 42 formed by the fourth laser beam can be the same as the scribe 45 created by the first laser beam or alternatively it can be narrower as shown in the figure.

One set of laser parameters has been found to work very effectively for carrying out the four laser process steps shown in FIGS. 13 and 14 for a solar panel based on a glass substrate having a lower electrode layer of Mo (Molybdenum) an active layer of CIGS (Cadmium Indium Gallium diSelenide) and an upper electrode layer of doped ZnO (Zinc oxide) and is given here as an example. For four laser beams operating at 1064 nm, and with a relative speed between the substrate and the laser beams of 500 mm/sec, scribes 45, 43 and 44 were effected by three identical beams 29, 40 and 41 each operating with a spot size on the substrate of 50 μm diameter, a pulse length of 3 ns, a repetition rate of 12.5 kHz and a power of 125 mW while scribe 42 was effected immediately after scribe 29 using a spot size of 30 μm, a pulse length of 10 ns, a repetition rate of 20 kHz and a power of 800 mW. This is a specific example and each of these parameters may be varied, eg within a range of +/−10-20%, and other combinations of laser parameters can also be used to carry out the process depending on the circumstances.

Various additional ink jet processes are required to complete the cell interconnection as shown in FIG. 4 but these are not shown in this figure.

Figure 15:
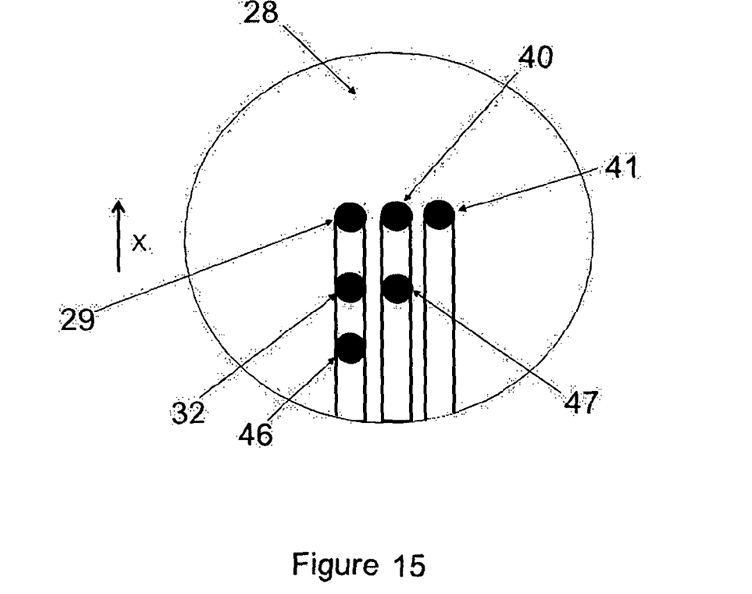

FIG. 15 shows a further embodiment of the invention applied to a "one step interconnection" of a three layer structure where more than four laser beams are used to make the three required scribes during the single passage of the process head across the substrate. The figure shows part of the moving process head 28 which is arranged such that first, second and third laser beams 29, 40, and 41 which are likely to have identical properties are delivered to the substrate in order to scribe first, second and third parallel grooves through the top electrode layer on the substrate as the head moves across the substrate. After the first, second and third laser beams have passed over the substrate only the third scribe is complete so fourth and fifth laser beams 32 and 47 are then directed into first and second scribes respectively to remove the active layer leaving the lower electrode layer. Fourth and fifth laser beams are likely to be similar to each other in terms of wavelength, pulse length, energy density and spot size but are likely to differ from first and second laser beams. Alternatively, fourth and fifth laser beams may be similar to first and second laser beams, respectively. After the fourth and fifth laser beams have passed over the substrate the second scribe is complete but the first scribe is still incomplete. Hence, sixth laser beam 46 which is likely to be different to both first laser beam 29 and fourth laser beam 32, but may be similar to one or both of them, is directed into the first scribe to remove the lower electrode layer to complete the scribe.

Thus, when three laser beams are used sequentially in a single pass to form a single groove through three layers of different materials on a substrate, the first beam removes the first layer, the second beam removes the second layer and the third beam removes the third layer. And, preferably, all three laser beams are different.

Figure 16:
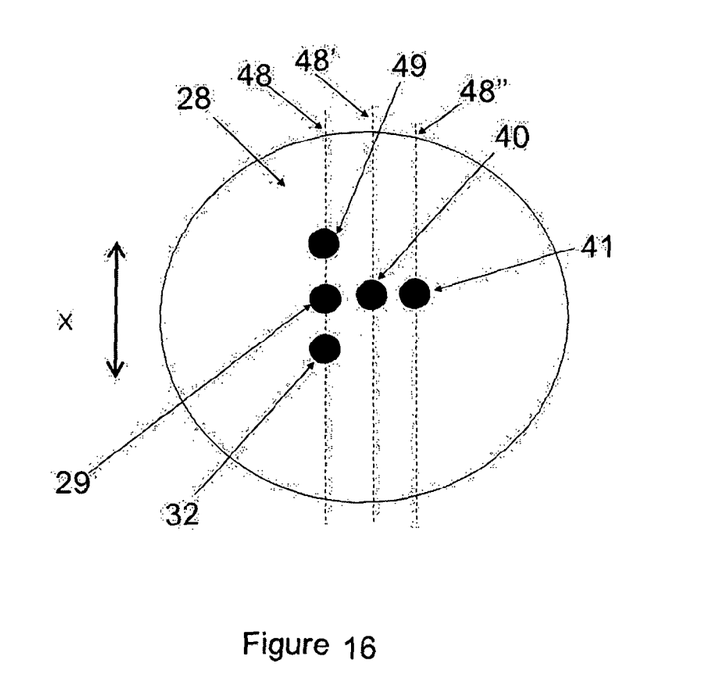

FIG. 16 shows another embodiment of the invention applied to a process head which is arranged to be able to carry out a "one step interconnection" process in both directions of movement of the process head over the substrate. This shows part of the moving process head 28 which is arranged such that first, second and third laser beams 29, 40, and 41 are delivered to the substrate in order to scribe three parallel grooves 48, 48' and 48" through one or two of the layers on the substrate as the head moves across the substrate. In a first preferred embodiment, first laser beam 29 forms a first scribe, second laser beam 40 forms a second scribe and third laser beam 41 forms a third scribe all of which are similar in that the top two layers of material are removed leaving the lower electrode layer intact. In this case the first, second and third laser beams have similar or even identical properties in terms of wavelength, pulse length, spot size and energy density (which is convenient in practice). After the first, second and third laser beams have passed over the substrate, second and third scribes are complete but first scribe is incomplete as complete removal of the lower electrode layer is required to allow eventual cell formation and interconnection. Hence, fourth laser beam 32, which may be different or similar to first laser beam 29, is directed into the first scribe after the first laser beam 29 to remove the lower electrode layer to complete the scribe to the required depth. Fifth laser beam 49 which is identical to fourth laser beam and is arranged on the line 48 joining first and fourth laser beams on the opposite side of the first laser beam to the fourth laser beam is activated when the relative motion of the head and the substrate is in the opposite X direction.

Figure 17:
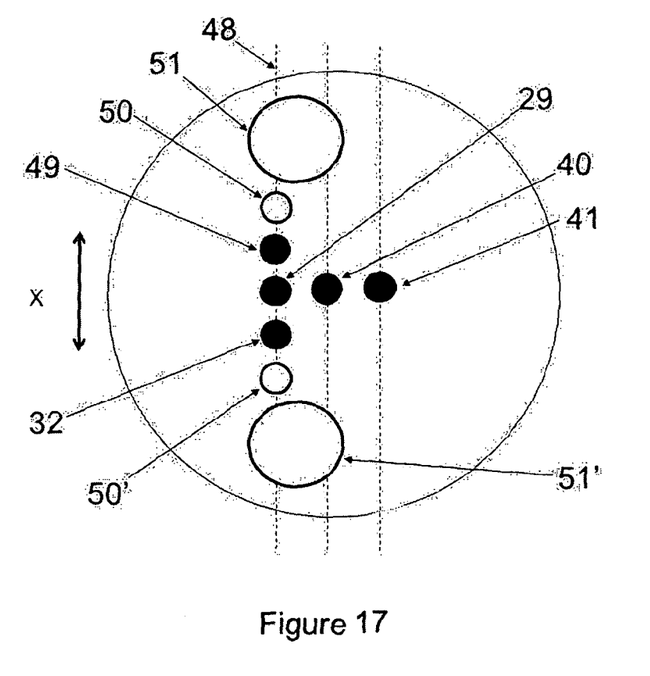

FIG. 17 illustrates some of the additional components of the process head required to allow a "one step interconnection" to be completed in both directions of movement of the head as mentioned above. As well as first, second and third laser beams 29, 40 and 41 for removing the top two layers in first, second and third parallel scribes, fourth and fifth laser beams 32 and 49 are shown for completing the first scribe for either X direction of travel of the head over the substrate (as described in relation to FIG. 16). In addition, first and second ink jet heads 50 and 50' for depositing insulating ink into the first scribe and third and fourth ink jet heads 51 and 51' for depositing conducting ink over the filled first scribe and into the second scribe are shown.

When a laser beam is directed at the substrate from beneath as mentioned above (and shown in dashed lines in the figures), material from the cuts being formed is ejected from the upperside of the device. It is thus desirable to provide an extraction device (not shown) to collect such debris to so it does not fall back onto the surface of the device. An extraction nozzle may, for instance, be provided on the process head located above the device.

As described above the process head(s) are moved relative to the device so as to pass over the device in the X direction and to be stepped in the Y-direction from one interconnect to the next to be formed. The relative motion between the substrate and process head(s) can be effected in a number of ways, eg the substrate may be stationary substrate and process head(s) moved in two axes, the process head(s) may be stationery and the substrate moved in two axes, or the process head(s) moved in one axis and the substrate moved in the orthogonal axis.

The invention claimed is:

1. A method for dividing a thin film device comprising a substrate having thereon a first layer, which is a lower electrode layer, a second layer, which is an active layer, and a third layer, which is an upper electrode layer, all the layers being continuous over the device, into separate cells which are to be electrically interconnected in series, at least the dividing of the cells being carried out in a single pass of a process head across the device, the process head performing at least the following steps in the single pass:
   a) making a first cut through the first, second and third layers;
   b) making a second cut through the second and third layers, the second cut being adjacent to the first cut;
   c) making a third cut through the third layer, the third cut being adjacent to the second cut and on the opposite side of the second cut to the first cut;
   wherein at least one of the first and second cuts is formed using two laser beams sequentially during the single pass of the process head across the device, the first laser beam forming a cut through the third layer, or the third and the second layer, without damaging at least one underlying layer and the second laser beam being directed through the cut formed by the first laser beam or through the substrate to form a cut through at least one of said at least one underlying layer.

2. The method as claimed in claim 1 wherein electrical connections between adjacent cells are also carried out during said single pass, the process head also performing the following steps in the single pass:
   d) using a first ink jet print head to deposit a non-conducting material into the first cut; and
   e) using a second ink jet print head to apply conducting material to bridge the non-conducting material in the first cut and either fully or partially fill the second cut such that an electrical connection is made between the first layer and the third layer,
   step (a) preceding step (d), step (d) preceding step (e) and step (b) preceding step (e), otherwise the steps may be carried out in any order in the single pass of the process head across the device.

3. The method as claimed in claim 1 wherein the width of the cut formed by the second laser beam is the same as or narrower than the cut formed by the first laser beam.

4. The method as claimed in claim 1 wherein a single process head is provided above the device and the two laser beams are provided therefrom and spaced from each other by a fixed distance in the direction of movement of the process head during said pass.

5. The method as claimed in claim 1 wherein the process head comprises a first part above the device and a second part beneath the device, the first laser beam being provided from the first part or the second part and the second laser beam being provided from the second part or the first part, the first and second parts being arranged to move as one relative to the device and the first and second laser beams being spaced from each other by a fixed distance in the direction of movement of the process head during said pass.

6. The method as claimed in claim 1 wherein the first laser beam forms a cut through the second and third layers and the second laser beam then forms a cut through the first layer.

7. The method as claimed in claim 1 wherein the first and second laser beams differ from each other by one or more of the following characteristics: wavelength, pulse length, and pulse repetition rate.

8. The method as claimed in claim 7 wherein the first and second laser beams are derived from different laser sources.

9. The method as claimed in claim 7 wherein the first and second laser beams are derived from the same laser source.

10. The method as claimed in claim 7 wherein the first and second laser beams have the same wavelength and pulse rate.

11. The method as claimed in claim 1 wherein the first cut is formed using three laser beams sequentially during the single pass of the process head across the device, the first laser beam forming a cut through the third layer, the second laser beam forming a cut through the second layer and the third laser beam forming a cut through the first layer.

12. The method as claimed in claim 11 wherein one or more of the characteristics of the first, second and third laser beams are all different from each other.

13. The method as claimed in claim 1 wherein the process head is able to carry out all said steps in a single pass in either or both directions across the thin film device.

14. The method as claimed in claim 1 wherein the thin film device is one of the following: a solar panel, a lighting panel and a battery.

15. An apparatus for dividing a thin film device comprising a substrate having thereon a first layer which is a lower electrode layer, a second layer which is an active layer and a third layer which is an upper electrode layer, all the layers being continuous over the device, into separate cells which are to be electrically interconnected in series, the apparatus comprising a process head on which are provided:
   a) one or more cutter units for making a first cut through the first, second and third layers, a second cut through the second and third layers adjacent to the first cut and a third cut through the third layer adjacent to the second cut and on the opposite side of the second cut to the first cut;
   b) drive means for moving the process head relative to the device; and
   c) control means for controlling movement of the process head relative to the device and actuating said one or more cutter units so that division of the device into separate cells can all be carried out in a single pass of the process head across the device,
   one or more of the cutter units comprising a first laser source and a second laser source which are spaced from each other by a fixed distance in a direction corresponding to the direction of movement of the process head during said pass, the control means being arranged to control the first and second laser sources such that at least one of the first and second cuts is formed using the first and second laser beams sequentially during the single pass of the process head across the device, the first laser beam forming a cut through the third layer, or the third and second layers, without damaging at least one underlying layer and the second laser beam being directed through the cut formed by the first laser beam or through the substrate to form a cut through at least one of said at least one underlying layer.

16. The apparatus as claimed in claim 15 wherein the process head is also provided with:
   d) a first ink jet print head for depositing a non-conducting material into the first cut; and
   e) second ink jet print head for applying conducting material to bridge the non-conducting material in the first cut and either fully or partially fill the second cut so that an electrical connection is made between the first layer and the third layer.

17. The apparatus as claimed in claim 16 wherein the relative positions on the process head of said one or more cutter units and/or of the first and second ink jet print heads determine the order in which the steps are carried out in the single pass.

18. The apparatus as claimed in claim 15 wherein a single process head is provided with the first and second laser sources provided thereon and spaced from each other by a fixed distance in the direction of movement of the process head during said pass.

19. The apparatus as claimed in claim 15 wherein the process head comprises a first part for positioning above the device and a second part for positioning beneath the device, the first laser source being provided on the first part or the second part and the second laser source being provided on the second part or the first part, the first and second parts being arranged to move as one relative to the device and the first and second laser sources being spaced from each other by a fixed distance in the direction of movement of the process head during said pass.

20. The apparatus as claimed in claim 15 wherein the first and second laser sources differ from each other by one or more of the following characteristics: wavelength, pulse length, and pulse repetition rate.

21. The apparatus as claimed in claim 20 wherein the first and second laser sources comprise separate lasers.

22. The apparatus as claimed in claim 20 wherein the first and second laser sources are derived from the same laser.

23. The apparatus as claimed in claim 20 wherein the first and second laser sources have the same wavelength and pulse rate.

24. The apparatus as claimed in claim 15 wherein said one or more cutter units comprises three laser sources which can be used sequentially during the single pass of the process head across the device to form said first cut, the first laser source being for forming a cut through the third layer, the second laser source being for forming a cut through the second layer and the third laser source being for forming a cut through the first layer.

25. The apparatus as claimed in claim 24 wherein one or more of the characteristics of the first, second and third laser sources differs from the other laser sources.

26. The apparatus as claimed in claim 15 wherein the process head is arranged to be able to carry out all said steps in a single pass in either or both directions across the thin film device.

27. The apparatus as claimed in claim 15 wherein the control system is arranged so that the device and process head move relative to each other in a first direction parallel to the lengths of the first, second and third cuts in a continuous path across the device and at the end of the path to step in a direction perpendicular to the first direction by a predetermined distance equal to the width of the cells to be formed in the device or a multiple thereof.

* * * * *